(12) United States Patent
Yamazaki et al.

(10) Patent No.: US 7,667,514 B2
(45) Date of Patent: Feb. 23, 2010

(54) DELAY CIRCUIT AND ELECTRONIC DEVICE INCLUDING DELAY CIRCUIT

(75) Inventors: Takema Yamazaki, Suwa (JP); Masayuki Ikeda, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/958,859

(22) Filed: Dec. 18, 2007

(65) Prior Publication Data
US 2008/0164923 A1    Jul. 10, 2008

(30) Foreign Application Priority Data
Jan. 10, 2007   (JP) .............................. 2007-002042
Oct. 3, 2007    (JP) .............................. 2007-259484

(51) Int. Cl.
H03H 11/26  (2006.01)
(52) U.S. Cl. .................. 327/276; 327/112; 327/263; 326/87
(58) Field of Classification Search .................. None
See application file for complete search history.

(56) References Cited
U.S. PATENT DOCUMENTS
4,806,804 A * 2/1989 O'Leary ................. 327/277
5,568,103 A * 10/1996 Nakashima et al. ......... 331/185
6,992,536 B2 * 1/2006 Kiyose et al. ............ 331/177 R
7,205,855 B2 * 4/2007 Maruyama et al. ............ 331/74

FOREIGN PATENT DOCUMENTS
JP         06-125252       6/1994
JP         2006-217172     8/2006

* cited by examiner

Primary Examiner—An T Luu
(74) Attorney, Agent, or Firm—Harness, Dickey & Pierce, P.L.C.

(57) ABSTRACT

A delay circuit includes: a current control circuit which has n (n is 1 or larger natural number) control pins and a first output line, and is capable of controlling current outputted from the first output line in response to n control signals inputted to the corresponding n control pins; a current mirror circuit connected with the first output line to produce current mirror current from the current and output the current mirror current from a second output line; a first active element having a gate pin and an input pin, the gate pin is connected with the second output line, and the input pin is connected with the first voltage line; a second active element having a gate pin and an input pin, the gate pin is connected with the first output line, and the input pin is connected with the second voltage line; and an inverter circuit having third and fourth active elements connected in series between an output pin of the first active element and an output pin of the second active element.

5 Claims, 13 Drawing Sheets

| DECODER INPUT | | | DECODER OUTPUT | | | | | | |
|---|---|---|---|---|---|---|---|---|---|
| Sw1 | Sw2 | Sw3 | 1 | 2 | 3 | 4 | 5 | 6 | 7 |
| O | × | × | O | × | × | × | × | × | × |
| × | O | × | O | O | × | × | × | × | × |
| O | O | × | O | O | O | × | × | × | × |
| × | × | O | O | O | O | O | × | × | × |
| O | × | O | O | O | O | O | O | × | × |
| × | O | O | O | O | O | O | O | O | × |
| O | O | O | O | O | O | O | O | O | O |

DELAY CIRCUIT AND ELECTRONIC DEVICE INCLUDING DELAY CIRCUIT

BACKGROUND

1. Technical Field

The present invention relates to a delay circuit and an electronic device including a delay circuit.

2. Related Art

Currently, a delay circuit for delaying an input signal by a predetermined period is used for various purposes. Examples of unit for varying delay time of the delay circuit involve a digital variable delay circuit which varies delay by changing the row number of the circuit, and an analog variable delay circuit which varies delay by changing driving current or load given to a delay element. In case of the digital variable delay circuit, current consumption increases and accuracy lowers in proportion to the row number of the circuit.

In order to overcome this drawback, a method disclosed in JP-A-6-125252 changes power to be supplied to a delay circuit by switching a plurality of power sources using a switch to control delay time. According to the method shown in JP-A-6-125252, however, error is produced by ON-state resistance generated from the switch area. In this case, designing for producing desired delay is difficult.

As an improvement over this disadvantage, a method disclosed in JP-A-2006-217172 controls current and adjusts delay by using a current mirror so as to obtain delay in proportion to a control signal.

According to the method shown in JP-A-2006-217172, highly accurate control can be achieved. However, since delay is controlled by an analog method, control for obtaining desired delay is difficult.

SUMMARY

It is an advantage of some aspects of the invention to provide a delay circuit and an electronic device including a delay circuit according to one of the following examples or applications capable of solving at least a part of the above problems.

Application 1

A delay circuit according to a first aspect of the invention includes: a current control circuit which has n (n is 1 or larger natural number) control pins and a first output line, and is capable of controlling current outputted from the first output line in response to n control signals inputted to the corresponding n control pins; a current mirror circuit connected with the first output line to produce current mirror current from the current and output the current mirror current from a second output line; a first active element having a gate pin and an input pin, the gate pin is connected with the second output line, and the input pin is connected with the first voltage line; a second active element having a gate pin and an input pin, the gate pin is connected with the first output line, and the input pin is connected with the second voltage line; and an inverter circuit having third and fourth active elements connected in series between an output pin of the first active element and an output pin of the second active element.

According to this structure, current to be supplied to the inverter circuit can be controlled in accordance with the control signals received from the n control pins by a digitized method. Thus, control over delay of the inverter circuit can be achieved in a digitized manner by the delay circuit provided in this example.

Application 2

It is preferable that the current control circuit of the above delay circuit has n active elements connected in parallel between the first voltage line and the first output line. In this case, the n active elements of the current control circuit are connected with the corresponding n control pins. Also, the pth (p is one of all natural numbers in the range from 1 to n) active element in the n active elements of the current control circuit is so constructed as to carry $I \times m^{p-1}$ (I is predetermined current, m is a real number other than 0). In addition, the current control circuit changes current outputted from the first output line by switching between continuity and non-continuity of the n active elements in response to the n control signals.

According to this structure, the current control circuit can output $2^n$ types of current in accordance with combinations of the control signals received from the n control pins. Since delay is inversely proportional to current, the delay circuit provided in this example can control delay inversely proportional to current by a digitized method.

Application 3

It is preferable that the current control circuit of the above delay circuit has n active elements each output pin and each gate pin of which are connected with the first output line, and n switching elements connected between the corresponding input pins of the n active elements and the second voltage line. In this case, the n switching elements of the current control circuit are connected with the corresponding n control pins. Also, the pth (p is one of all natural numbers in the range from 1 to n) active element in the n active elements of the current control circuit is so constructed as to have gate width of $W \times m^{p-1}$ (W is a predetermined gate width, m is a real number other than 0). In addition, the current control circuit divides current outputted from the first output line by switching between continuity and non-continuity of the n switching elements in response to the n control signals.

According to this structure, the current control circuit switches $2^n$ types of gate width in accordance with combinations of the control signals received from the n control pins. Since delay is proportional to gate width, the delay circuit provided in this example can control delay proportional to gate width by a digitized method.

Application 4

It is preferable that the current control circuit of the above delay circuit has n active elements each output pin and each gate pin of which are connected with the first output line, and n switching elements connected between the corresponding input pins of the n active elements and the second voltage line. In this case, the n switching elements of the current control circuit are connected with the n control pins. Also, the n active elements of the current control circuit are constructed to have the same size. In addition, the current control circuit divides current outputted from the first output line by switching between continuity and non-continuity of the n switching elements in response to the n control signals.

According to this structure, the current control circuit can reduce the effect of variation in manufacture of the n active elements.

Application 5

It is preferable that the n control pins of the delay circuit according to Application 4 are connected with a shift register.

According to this structure, the number of external pins for controlling the n control pins can be reduced. Thus, control can be simplified.

Application 6

It is preferable that the n control pins of the delay circuit according to Application 4 are connected with a decoder.

According to this structure, the number of external pins for controlling the n control pins can be reduced. Thus, control can be simplified.

Application 7

A delay circuit according to another aspect of the invention includes a plurality of delay circuits described above, which are adjusted to produce different delays and used in combination.

According to this structure, delay in a wide range can be adjusted with high accuracy.

Application 8

An electronic device according to another aspect of the invention includes the delay circuit described above.

According to this structure, the electronic device provided in this example can control delay in a digitized manner.

BRIEF DESCRIPTION OF THE DRAWINGS

The invention will be described with reference to the accompanying drawings, wherein like numbers reference like elements.

DESCRIPTION OF EXEMPLARY EMBODIMENTS

Delay circuits according to several embodiments are hereinafter described with reference to the appended drawings.

FIRST EMBODIMENT

Structure of Delay Circuit

Figure 1:
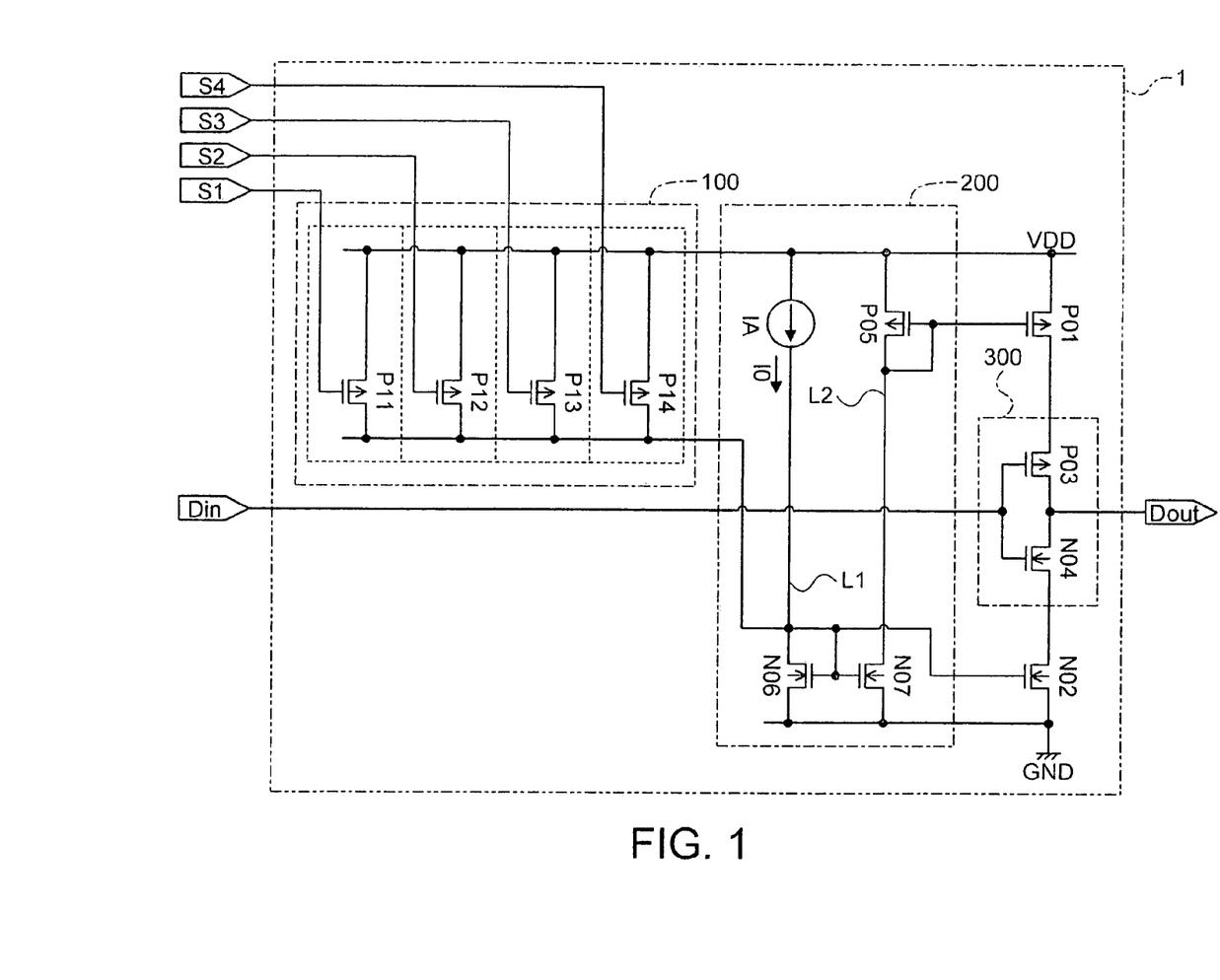
FIG. 1 is a circuit diagram showing a structure of a delay circuit according to a first embodiment.

Initially, a structure of a delay circuit according to a first embodiment is discussed with reference to FIG. 1. FIG. 1 is a circuit diagram showing the structure of the delay circuit in the first embodiment of the invention. As shown in FIG. 1, a delay circuit 1 includes a current control circuit 100, a current mirror circuit 200, a Pch transistor P01 as a first active element, an Nch transistor N02 as a second active element, and an inverter circuit 300.

The current control circuit 100 is constituted by four active elements (n=4) of Pch transistors P11 through P14. Each source pin as input pin of the Pch transistors P11 through P14 is connected with a power supply voltage line VDD as a first voltage line, and each drain pin as output pin of the Pch transistors P11 through P14 is connected with a line L1 as a first output line. Also, each gate pin of the Pch transistors P11 through P14 is connected with the corresponding one of four control pins S1 through S4.

Assuming that predetermined current is I (e.g., I=15 μA) with m=2, the P11 as the p=1st Pch transistor is designed to carry current of $I \times 2^{1-1}=I$ when the voltage of the control pin S1 is set at 0V. Similarly, the P12 as the p=2nd Pch transistor is designed to carry current of $I \times 2^{2-1}=I \times 2$ when the voltage of the control pin S2 is set at 0V. The P13 as the p=3rd Pch transistor is designed to carry current of $I \times 2^{3-1} \times 4$ when the voltage of the control pin S3 is set at 0V. The P14 as the p=4th Pch transistor is designed to carry current of $I \times 2^{4-1}=I \times 8$ when the voltage of the control pin S4 is set at 0V.

The current mirror circuit 200 is constituted by an ideal constant current source IA, a Pch transistor P05, and two Nch transistors N06 and N07. The ideal constant current source IA is connected between the power supply voltage line VDD and the line L1. The source pin of the Nch transistor N06 is connected with a ground voltage line GND as a second voltage line, and the gate pin and the drain pin of the Nch transistor N06 are connected with the line L1. The source pin, gate pin, and drain pin of the Nch transistor N07 are connected with the ground voltage line GND, the line L1, and a line L2 as a second output line, respectively. The source pin of the Pch transistor P05 is connected with the power supply voltage line VDD, and the gate pin and the drain pin of the Pch transistor P05 are connected with the line L2.

The current mirror circuit 200 outputs from the line L2 current mirror current obtained by current-mirroring the total current outputted from the ideal constant current source IA and the current control circuit 100 and carried on the line L1.

The source pin and gate pin of the Pch transistor P01 are connected with the power supply voltage line VDD and the line L2, respectively. The source pin and gate pin of the Nch transistor N02 are connected with the ground voltage line GND and the line L1, respectively.

The inverter circuit 300 is constituted by a Pch transistor P03 as a third active element, and an Nch transistor N04 as a fourth active element. The source pin, gate pin, and drain pin of the Pch transistor P03 are connected with the drain pin of the Pch transistor P01, an input signal line Din, and an output signal line Dout, respectively. The source pin, gate pin, and drain pin of the Nch transistor N04 are connected with the drain pin of the Nch transistor N02, the input signal line Din, and the output signal line Dout, respectively.

Delay of the inverter circuit 300 is controlled by current flowing to the gate pin of the Pch transistor P01 from the line L2 and current flowing to the gate pin of the Nch transistor N02 from the line L1.

Figure 2:
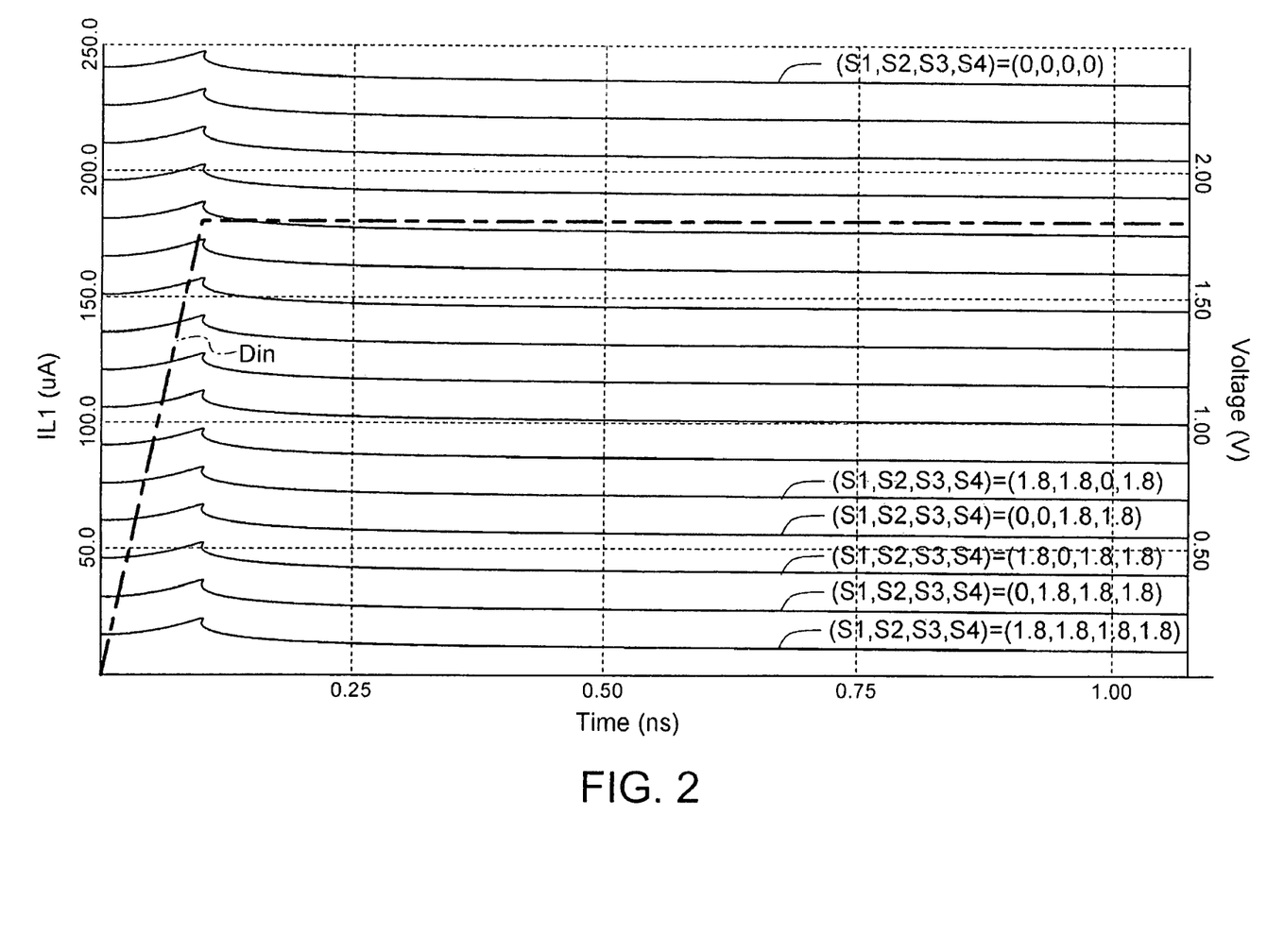
FIG. 2 is a timing chart showing current outputted from a current control circuit according to the first embodiment.

Current outputted from the current control circuit is now explained with reference to FIG. 2. FIG. 2 is a timing chart showing current outputted from the current control circuit. As shown in FIG. 2, the current control circuit 100 outputs $2^4=16$ types of current from the line L1 in response to control signals received from the four control pins S1 through S4.

For example, when control signals (S1, S2, S3, S4) (1.8V, 1.8V, 1.8V, 1.8V) are inputted with VDD=1.8V, all the Pch transistors P11 through P14 come to the non-continuity condition. In this case, current IL1 flowing through the line L1 is only current I0 supplied from the ideal constant current source IA. When control signals (S1, S2, S3, S4)=(0V, 0V, 0V, 0V) are inputted, all the Pch transistors P11 through P14 come to the continuity condition. In this case, the current IL1 flowing through the line L1 is current I0+I×(1+2+4+8).

Figure 3:
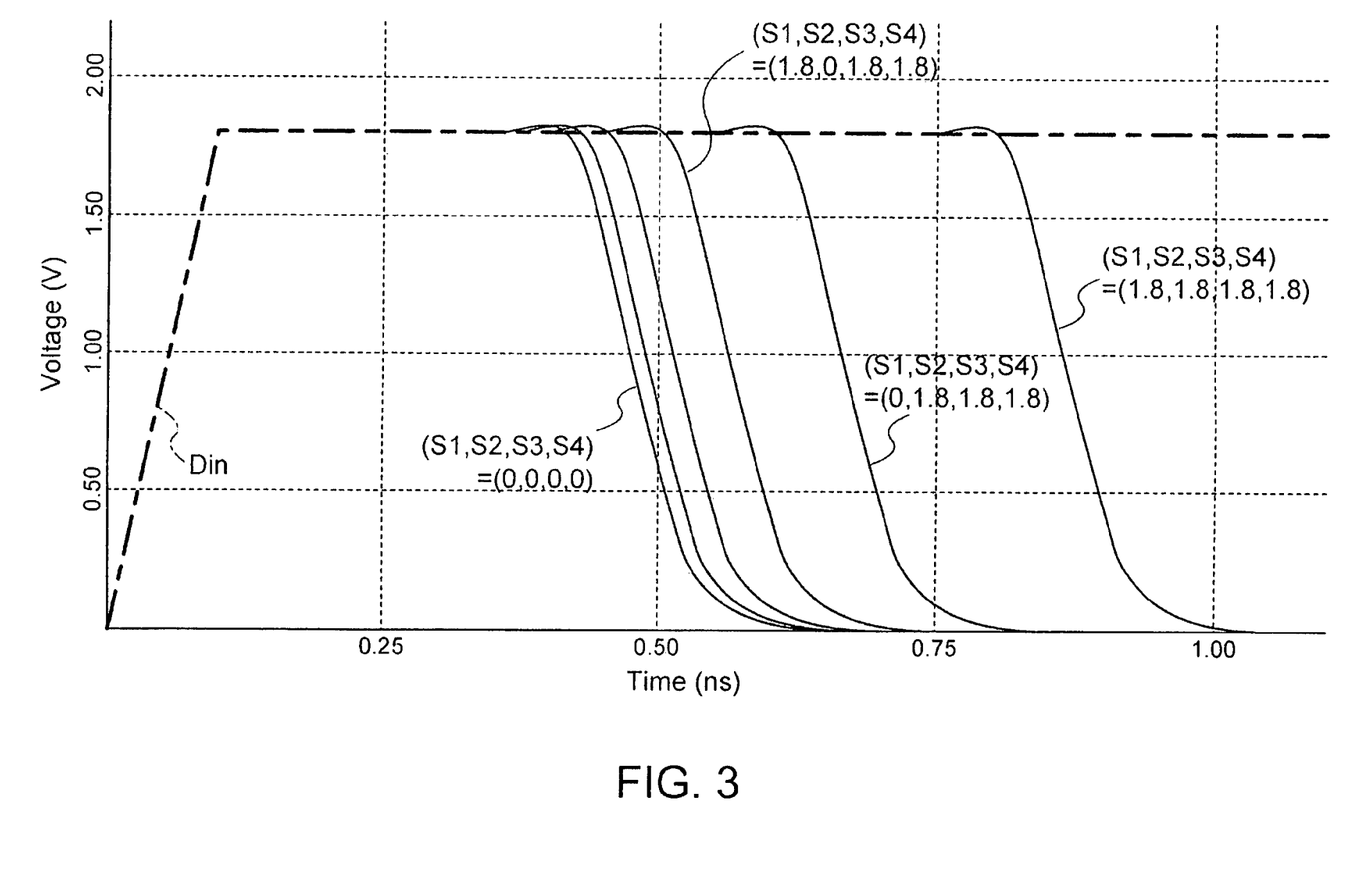
FIG. 3 is a timing chart showing delay produced by the delay circuit according to the first embodiment.

Delay produced by the delay circuit is now explained with reference to FIG. 3. FIG. 3 is a timing chart showing delay produced by the delay circuit. Since delay produced by the delay circuit is inversely proportional to the current flowing through the line L1, delay shown in FIG. 3 is obtained in response to the control signals received from the control pins S1 through S4 shown in FIG. 2.

The delay circuit in the first embodiment described above offers the following advantages.

According to the first embodiment, the current control circuit outputs $2^n$ types of current in accordance with combinations of the control signals received from the n control pins. Since delay is inversely proportional to current, the delay circuit provided in this embodiment can control delay inversely proportional to current by a digitized method.

SECOND EMBODIMENT

A delay circuit according to a second embodiment is now described. While the delay circuit capable of controlling delay inversely proportional to current by a digitized method has been discussed in the first embodiment, the delay circuit according to the second embodiment can control delay having proportional relationship by a digitized method.

Figure 4:
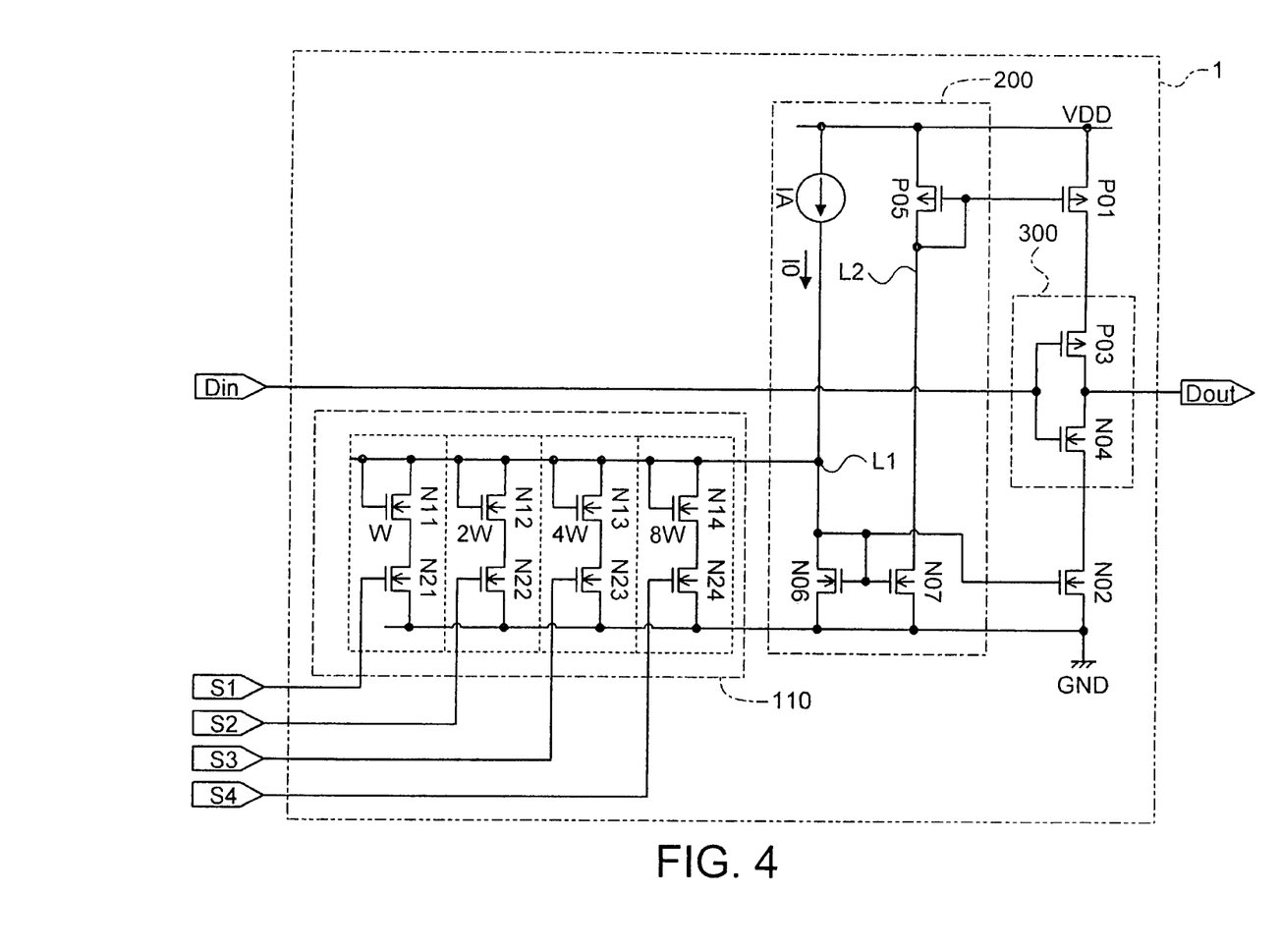
FIG. 4 is a circuit diagram showing a structure of a delay circuit according to a second embodiment.

Initially, the structure of the delay circuit according to the second embodiment is explained with reference to FIG. 4. FIG. 4 is a circuit diagram showing the structure of the delay circuit in the second embodiment according to the invention. As shown in FIG. 4, the delay circuit 1 includes a current control circuit 110, the current mirror circuit 200, the Pch transistor P01 as the first active element, the Nch transistor N02 as the second active element, and the inverter circuit 300.

The current control circuit 110 is constituted by four active elements (n=4) of Nch transistors N11 through N14, and four switching elements (n=4) of Nch transistors N21 through N24.

Each drain pin and each gate pin as output pins of the Nch transistors N11 through N14 are connected with the line L1 as the first output line. Each source pin of the Nch transistors N21 through N24 is connected with the ground voltage line GND as the second voltage line, and each drain pin of the Nch transistors N21 through N24 is connected with the corresponding source pin of the Nch transistors N11 through N14. Each gate pin of the Nch transistors N21 through N24 is connected with the corresponding pin of the four control pins S1 through S4.

Assuming that a predetermined gate width is W (e.g., W=0.3 μm) with m=2, the N11 as the p=1st Nch transistor is designed to have a gate width of $W×2^{1-1}=W$ and carry current IW proportional to 1/W when the voltage of the control pin S1 is set at 1.8V. Similarly, the N12 as the p=2nd Nch transistor is designed to have a gate width of $W×2^{2-1}=W×2$ and carry current IW/2 proportional to 1/(W×2) when the voltage of the control pin S2 is set at 1.8V. The N13 as the p=3rd Nch transistor is designed to have a gate width of $W×2^{3-1}=W×4$ and carry current IW/4 proportional to 1/(W×4) when the voltage of the control pin S3 is set at 1.8V. The N14 as the p=4th Nch transistor is designed to have a gate width of $W×2^{4-1}=W×8$ and carry current IW/8 proportional to 1/(W×8) when the voltage of the control pin S4 is set at 1.8V.

Figure 5:
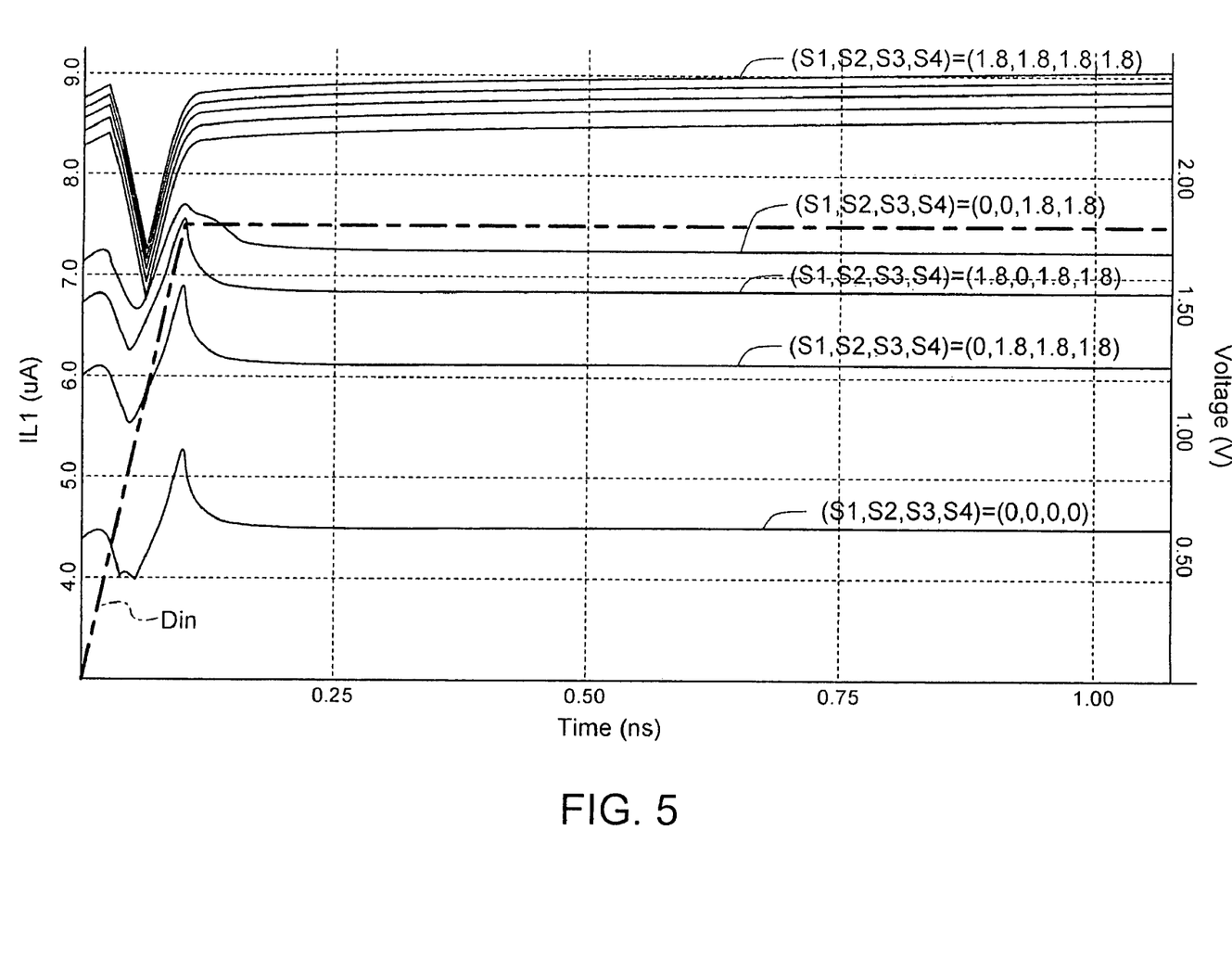
FIG. 5 is a timing chart showing current outputted from a current control circuit according to the second embodiment.

Current outputted from the current control circuit now explained with reference to FIG. 5. FIG. 5 is a timing chart showing current outputted from the current control circuit. As shown in FIG. 5, the current control circuit 110 outputs $2^4=16$ types of current from the line L1 in response to control signals received from the four control pins S1 through S4.

For example, when control signals (S1, S2, S3, S4)=(0V, 0V, 0V and 0V) are inputted, all the Nch transistors N21 through N24 come to the non-continuity condition. In this case, current IL1 flowing through the line L1 is only current I0 supplied from the ideal constant current source IA. When control signals (S1, S2, S3, S4)=(1.8V, 1.8V, 1.8V, 1.8V) are inputted, all the Nch transistors N21 through N24 come to the continuity condition. In this case, the current IL1 flowing through the line L1 is current I0+IW/(1+2+4+8).

Figure 6:
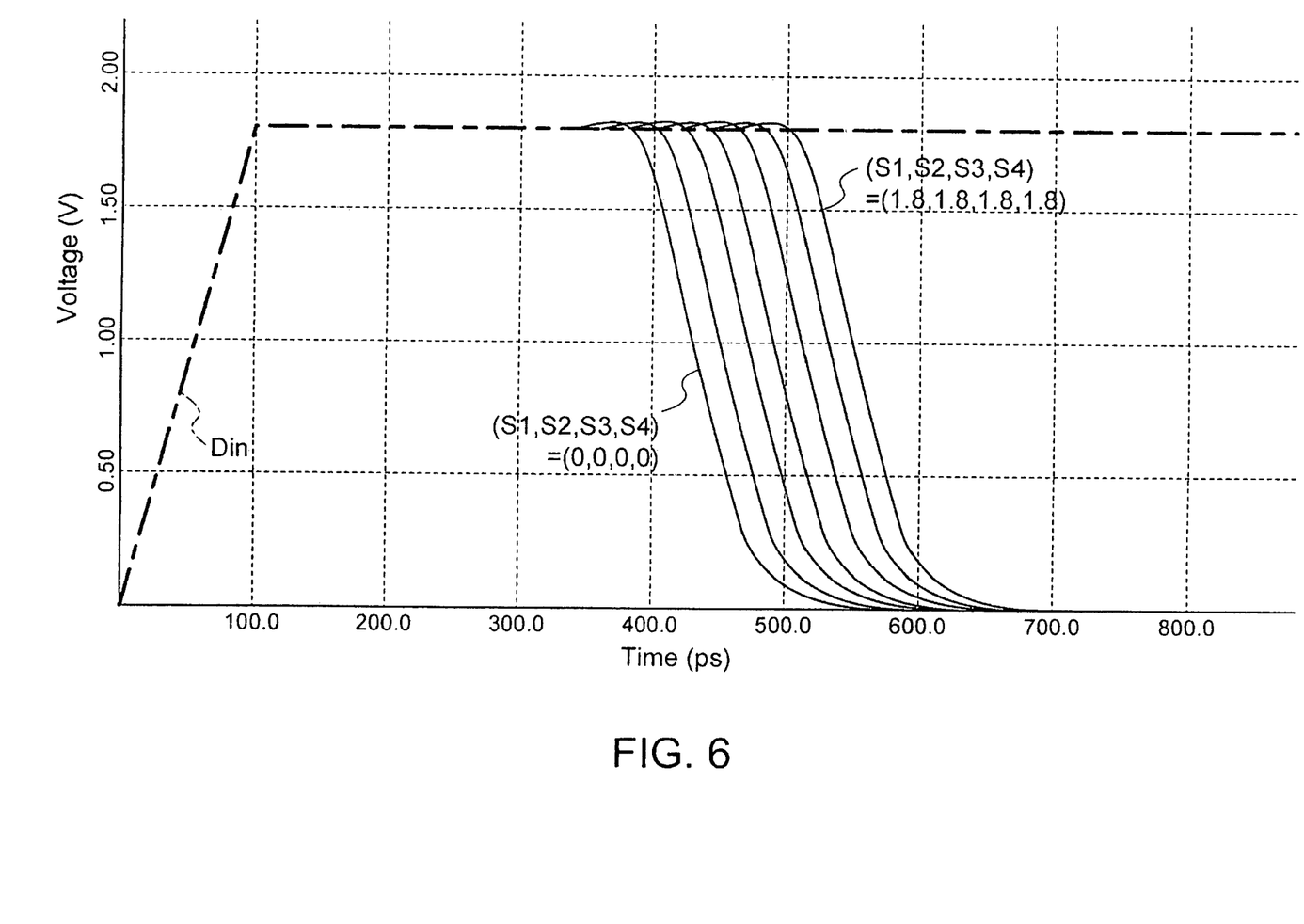
FIG. 6 is a timing chart showing delay produced by the delay circuit according to the second embodiment.

Delay produced by the delay circuit is now explained with reference to FIG. 6. FIG. 6 is a timing chart showing delay produced by the delay circuit. Since delay produced by the delay circuit is proportional to the current flowing through the line L1, delay shown in FIG. 6 is obtained in response to the control signals received from the control pins S1 through S4 shown in FIG. 5.

The delay circuit in the second embodiment described above offers the following advantages.

According to the second embodiment, the current control circuit switches $2^n$ types of gate width in accordance with combinations of the control signals received from the n control pins. Since delay is proportional to gate width, the delay circuit provided in this embodiment can control delay proportional to gate width by a digitized method.

While the delay circuits according to the specific embodiments have been described, it is intended that the invention is not limited to these embodiments but may be practiced otherwise without departing from the scope and spirit of the invention. For example, the following modifications may be made.

MODIFIED EXAMPLE 1

A delay circuit according to a modified example 1 is now explained. While the delay circuit according to the first embodiment has the power supply voltage line VDD as the first voltage line, the ground voltage line GND as the second voltage line, and the Pch transistors as the n active elements, the delay circuit may have the ground voltage line GND as the first voltage line, the power supply voltage line VDD as the second voltage line, and the Nch transistors as the n active elements.

MODIFIED EXAMPLE 2

A delay circuit according to a modified example 2 is now explained. While the delay circuit according to the second embodiment has the power supply voltage line VDD as the first voltage line, the ground voltage line GND as the second voltage line, the Nch transistors as the n active elements, and the Nch transistors as the n switching elements, the delay circuit may have the ground voltage line GND as the first voltage line, the power supply voltage line VDD as the second voltage line, the Pch transistors as the n active elements, and the Pch transistors as the n switching elements.

MODIFIED EXAMPLE 3

Figure 7:
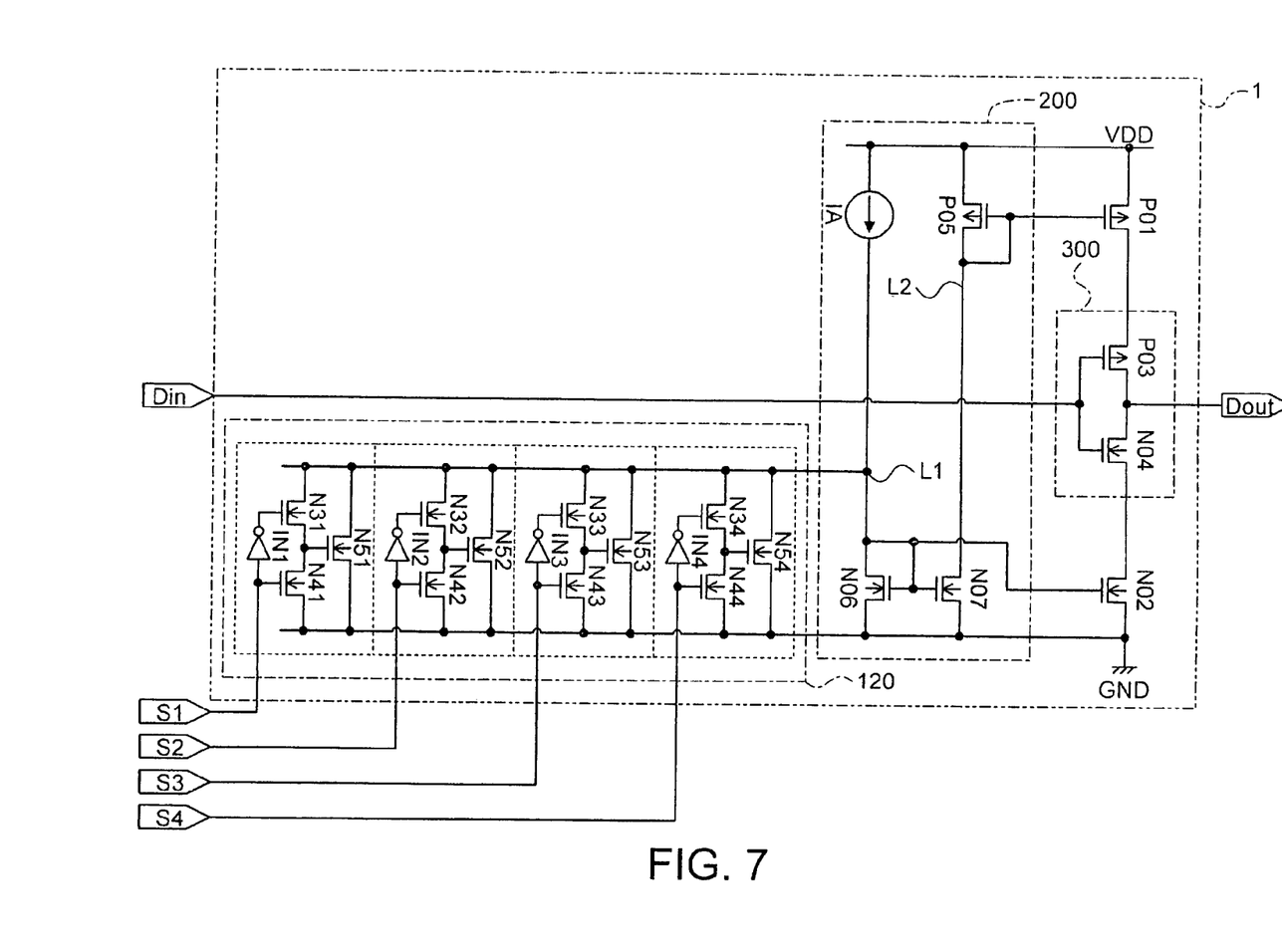
FIG. 7 is a circuit diagram showing a structure of a delay circuit according to a modified example 3.

A delay circuit according to a modified example 3 is now explained. While the current control circuit 110 shown in FIG. 4 is employed as the current control circuit in the second embodiment, the current control circuit may be a current control circuit 120 shown in FIG. 7.

MODIFIED EXAMPLE 4

Figure 8:
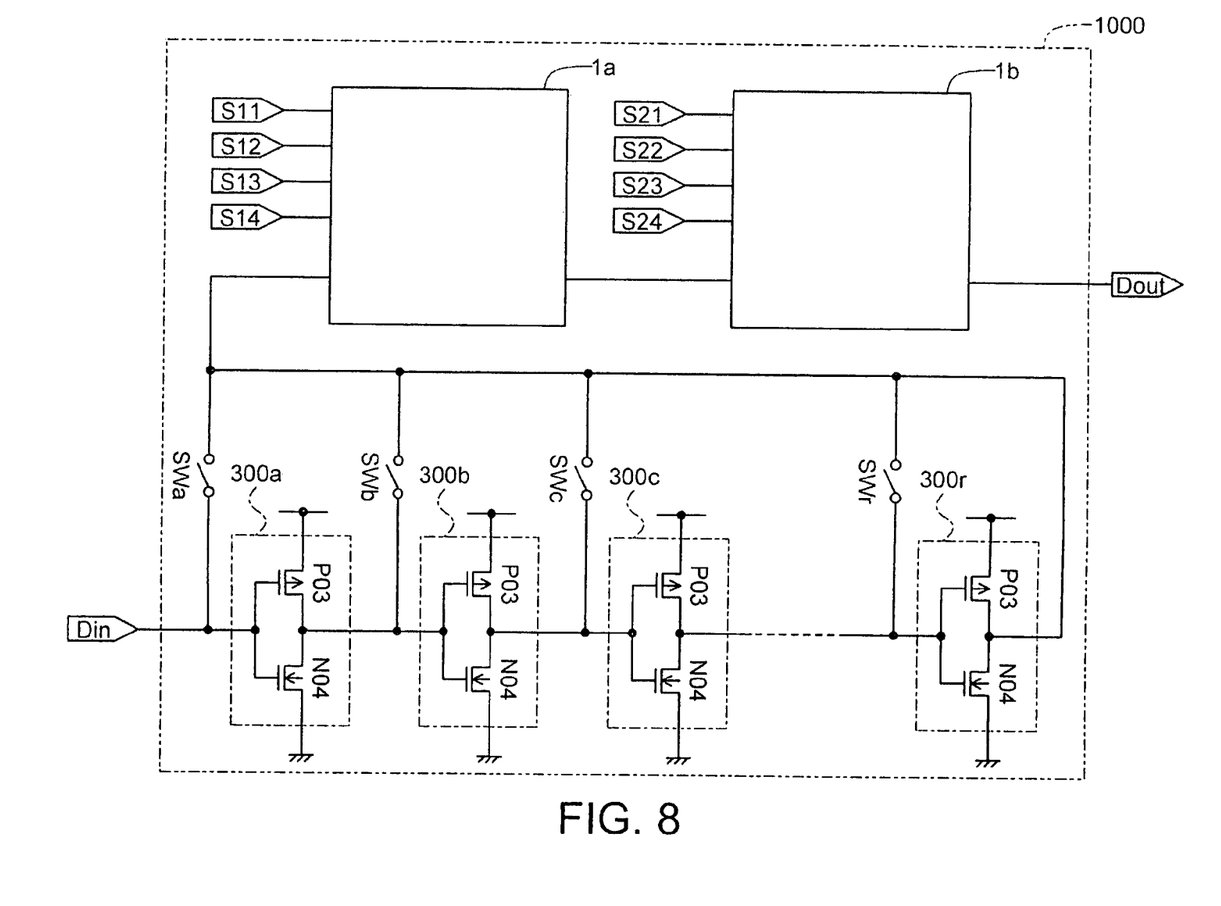
FIG. 8 is a circuit diagram showing a structure of a delay circuit according to a modified example 4.

A delay circuit according to a modified example 4 is now explained. While the delay circuit in the first and second embodiments is constituted by the single delay circuit 1, the delay circuit may be a delay circuit 1000 having a plurality of delay circuits 1a and 1b as illustrated in FIG. 8. In this case, delay in a wide range can be adjusted with high accuracy by designing the delay circuits 1a and 1b such that each of the circuits 1a and 1b produce different delay.

MODIFIED EXAMPLE 5

Figure 9:
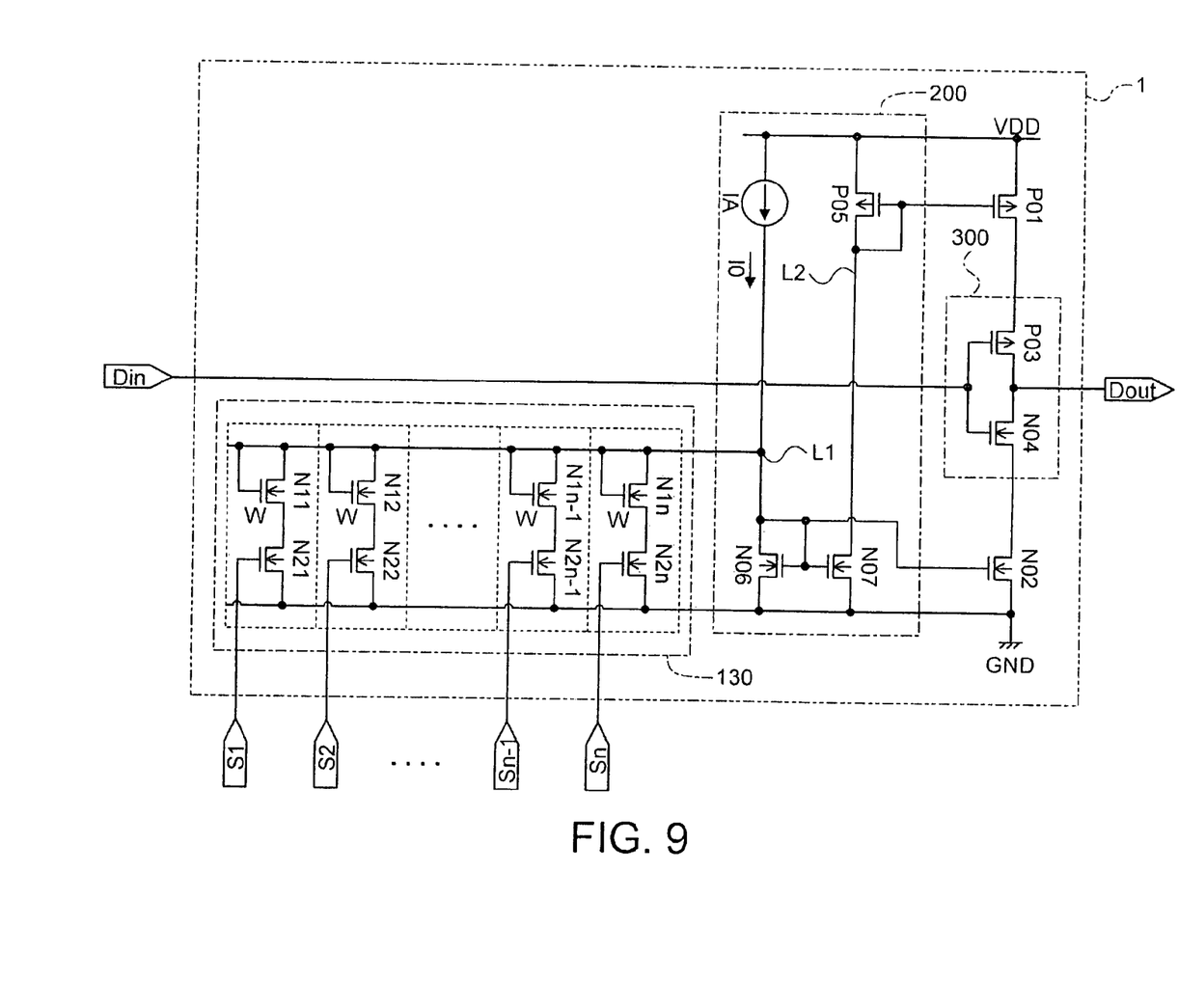
FIG. 9 is a circuit diagram showing a structure of a delay circuit according to a modified example 5.

A delay circuit according to a modified example 5 is now explained. According to the second embodiment, each gate width of the n active elements constituting the current control circuit 110 is set at $W \times 2^{p-1}$ (p is the pth active element) so as to produce delay at equal intervals by a digitized method. In this structure, however, desired delay time cannot be obtained in some cases due to variation in manufacture of the respective active elements. For reducing the effect of the manufacture variation, it is possible to employ a current control circuit 130 including n active elements all the gate widths W of which have the same size as shown in FIG. 9.

MODIFIED EXAMPLE 6

Figure 10A:
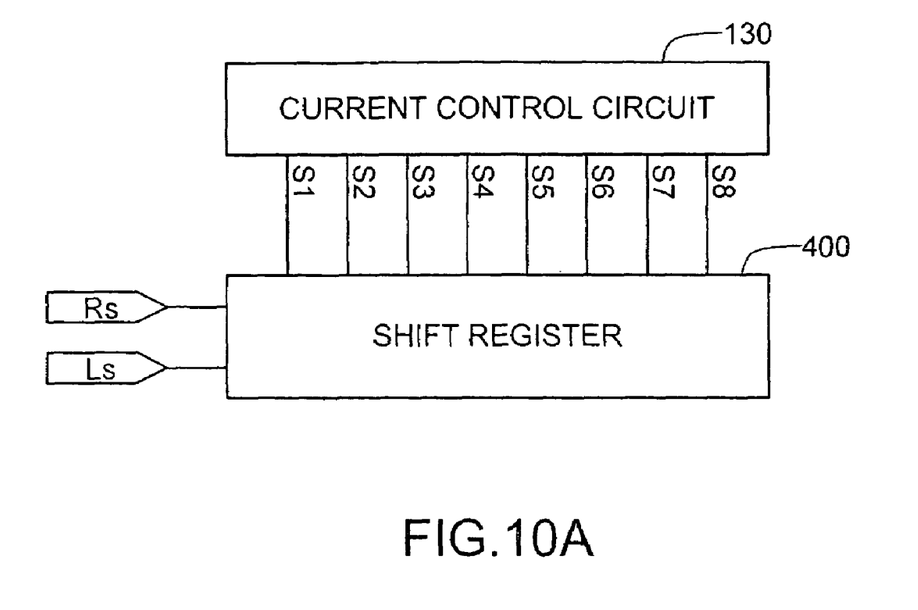
FIGS. 10A and 10B are circuit diagrams showing a structure of a delay circuit according to a modified example 6.
Figure 10B:
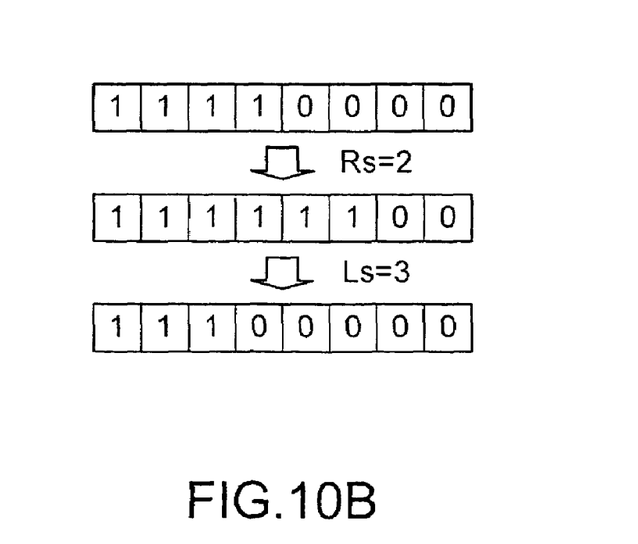

A delay circuit according to a modified example 6 is now explained. According to the modified example 5, the respective n active elements constituting the current control circuit 130 have the gate widths W of the same size. In this case, however, fifteen control pins are needed to perform current control equivalent to that of the current control circuit 110 shown in FIG. 4, and thus the control becomes complicated. For simplifying the control, it is possible to connect a shift register 400 for driving the n control pins of the current control circuit 130 and divide the external control pins into two parts of a right shift pin Rs and a left shift pin Ls as illustrated in FIG. 10A. For example, eight control pins S1 through S8 can be driven in a manner shown in FIG. 10B.

MODIFIED EXAMPLE 7

Figure 11A:
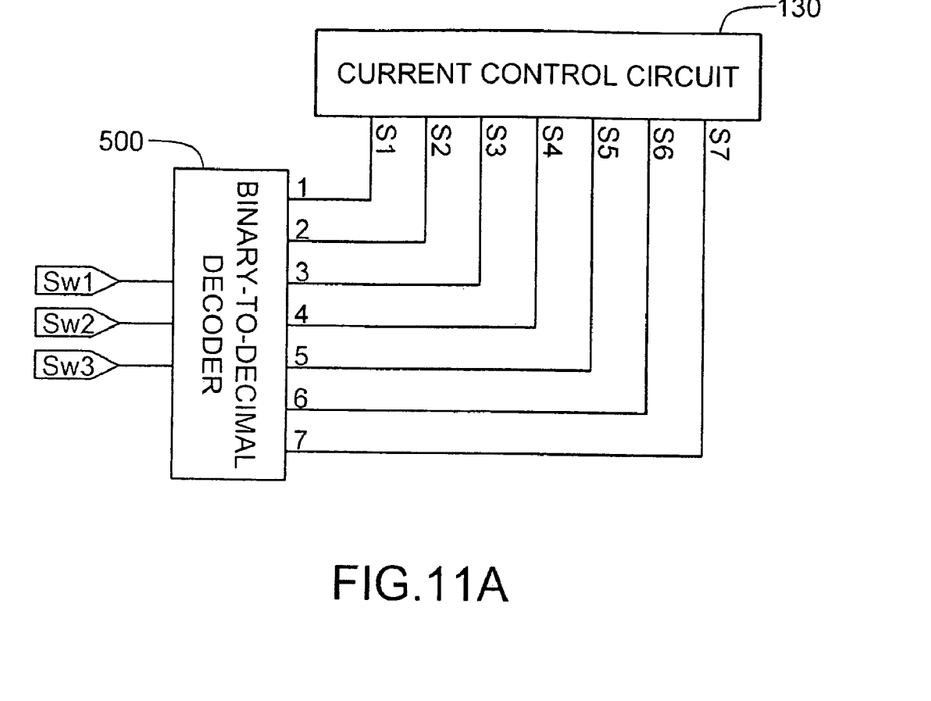
FIGS. 11A and 11B are circuit diagrams showing a structure of a delay circuit according to a modified example 7.
Figure 11B:
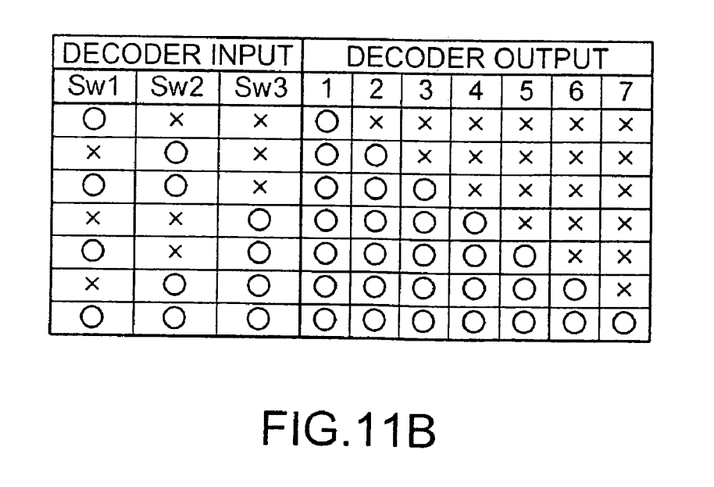

A delay circuit according to a modified example 7 is now explained. While the shift register 400 is connected to drive the n control pins of the current control circuit 130 in the modified example 6, a binary-to-decimal decoder 500 may be used as illustrated in FIG. 11A. For example, seven control pins S1 through S7 can be driven in a manner shown in FIG. 11B.

MODIFIED EXAMPLE 8

Figure 12:
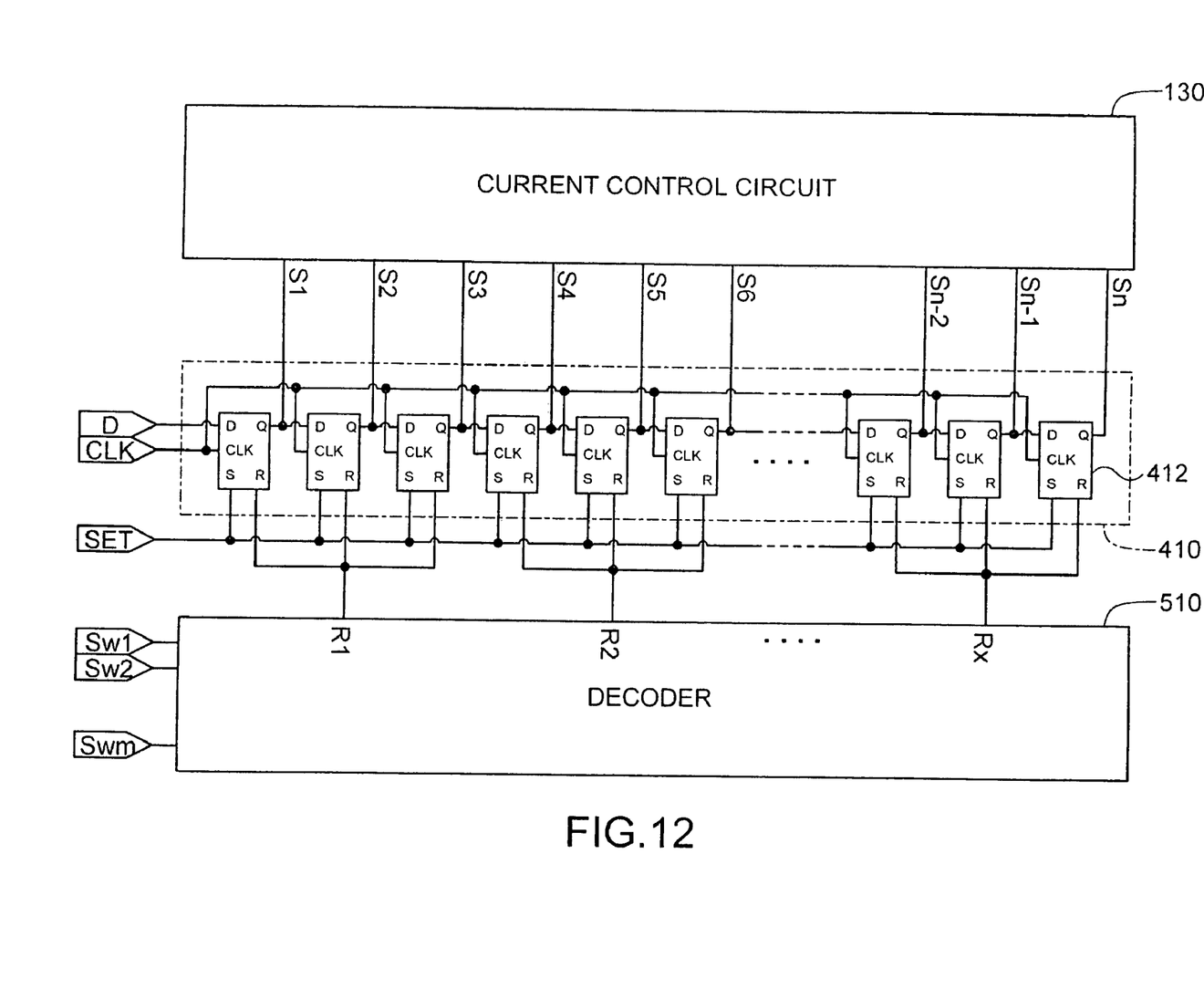
FIG. 12 is a circuit diagram showing a structure of a delay circuit according to a modified example 8.

A delay circuit according to a modified example 8 is now explained. While the shift register 400 or the binary-to-decimal decoder 500 is used to drive the n control pins of the current control circuit 130 in the modified examples 6 and 7, a shift register 410 and a decoder 510 may be used in combination as illustrated in FIG. 12.

According to each of n D flip-flops 412 constituting the shift register 410, an input value of a reset pin R is outputted from a pin Q when an input value of a set pin S is 0, and a value of a data pin D is outputted to the pin Q with rising of an input clock signal of a clock pin CLK when the input value of the set pin S is 1. The decoder 510 determines input values R1 through Rx of the reset pins R of the D flip-flops 412, and the shift register 410 determines values of n control pins S1 through Sn. According to this structure, the decoder 510 makes rough adjustment, and subsequently the shift register 410 makes fine adjustment. Accordingly, desired current control can be rapidly performed. Moreover, the circuit scale of the decoder 510 can be decreased from that of the binary-to-decimal decoder 500 shown in FIG. 11A.

MODIFIED EXAMPLE 9

Figure 13:
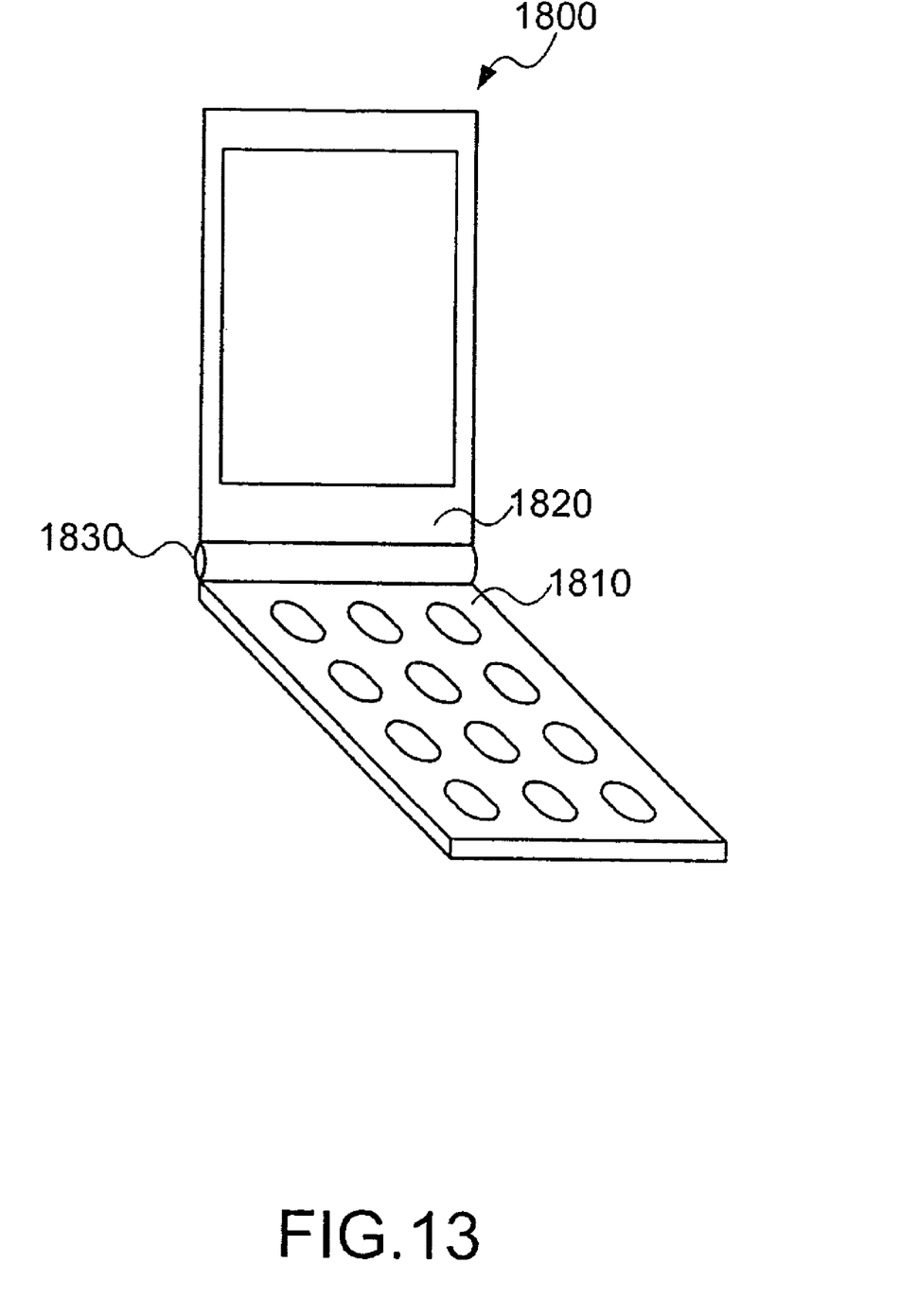
FIG. 13 schematically illustrates a structure of a cellular phone according to a modified example 9.

An example of electronic device including the delay circuit is now explained. FIG. 13 schematically illustrates a cellular phone 1800 as an electronic device according to a modified example 9. The cellular phone 1800 includes a main body unit 1810 having operation buttons and the like, and a display unit 1820 having a liquid crystal panel and the like. The main body unit 1810 and the display unit 1820 are connected with each other via a hinge 1830 such that both units can be folded. The main body unit 1810 contains a receiving circuit which includes the delay circuit 1. Examples of electronic device including the delay circuit also involve personal digital assistant (PDA) and portable personal computer which utilize wireless communication as well as the cellular phone 1800 described above.

The entire disclosure of Japanese Patent Application Nos. 2007-002042, filed Jan. 1, 2007 and 2007-259484, filed Oct. 3, 2007 are expressly incorporated by reference herein.

What is claimed is:

1. A delay circuit comprising:

a current control circuit which has n (n is 1 or larger natural number) control pins and a first output line, and is capable of controlling a first current outputted from the first output line in response to n control signals inputted to the corresponding n control pins;

a current source which is connected in parallel with the first output line and generates a predetermined current;

a current mirror circuit connected with the first output line to produce current mirror current from the first current and output the current mirror current from a second output line;

a first active element having a gate pin and an input pin, the gate pin is connected with the second output line, and the input pin is connected with a first voltage line;

a second active element having a gate pin and an input pin, the gate pin is connected with the first output line, and the input pin is connected with a second voltage line; and an inverter circuit having third and fourth active elements connected in series between an output pin of the first active element and an output pin of the second active element, wherein:

the current control circuit has n active elements each output pin and each gate pin of which are connected with the first output line, and n switching elements connected between the corresponding input pins of the n active elements and the second voltage line;

the n switching elements of the current control circuit are connected with the corresponding n control pins;

a pth (p is one of all natural numbers in the range from 1 to n) active element in the n active elements of the current control circuit is so constructed as to carry $I*m^{\wedge}(P-1)$ (I is a predetermined current, m is a real number other than 0); and the current control circuit controls current outputted from the first output line by switching between on and off of the n switching elements in response to the n control signals.

2. A delay circuit comprising:

a current control circuit which has n (n is 1 or larger natural number) control pins and a first output line, and is capable of controlling a first current outputted from the first output line in response to n control signals inputted to the corresponding n control pins;

a current source which is connected in parallel with the first output line and generates a predetermined amount of current;

a current mirror circuit connected with the first output line to produce current mirror current from the first current and output the current mirror current from a second output line;

a first active element having a gate pin and an input pin, the gate pin is connected with the second output line, and the input pin is connected with a first voltage line;

a second active element having a gate pin and an input pin, the gate pin is connected with the first output line, and the input pin is connected with a second voltage line; and an inverter circuit having third and fourth active elements connected in series between an output pin of the first active element and an output pin of the second active element, wherein:

the current control circuit has n active elements each output pin and each gate pin of which are connected with the first output line, and n switching elements connected between the corresponding input pins of the n active elements and the second voltage line;

the n switching elements of the current control circuit are connected with the corresponding n control pins;

a pth (p is one of all natural numbers in the range from 1 to n) active element in the n active elements of the current control circuit is so constructed as to have gate width of $W*m^{\wedge}(p-1)$ (W is predetermined gate width, m is a real number other than 0); and the current control circuit shunts the current outputted from the current outputted from the current source by switching between on and off of the n switching elements in response to the n control signals.

3. The delay circuit according to claim 1, wherein the n control pins are connected with a shift register.

4. The delay circuit according to claim 1, wherein the n control pins are connected with a decoder.

5. A delay circuit, comprising:

a plurality of delay circuits according to claim 1, which are adjusted to produce different delays and used in combination.

\* \* \* \* \*